United States Patent
Lee et al.

(10) Patent No.: US 8,144,756 B2
(45) Date of Patent: Mar. 27, 2012

(54) JITTER MEASURING SYSTEM AND METHOD

(75) Inventors: Yu Lee, Pingtung County (TW);
Nai-Chen Cheng, Changhua County (TW); Ji-Jan Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 527 days.

(21) Appl. No.: 12/232,553

(22) Filed: Sep. 19, 2008

(65) Prior Publication Data

US 2009/0088996 A1 Apr. 2, 2009

(30) Foreign Application Priority Data

Sep. 29, 2007 (TW) ................................ 96136601 A

(51) Int. Cl.
*H04B 17/00* (2006.01)
(52) U.S. Cl. ........ 375/226; 375/224; 375/227; 375/371; 375/373; 375/375; 375/376; 455/260; 455/516; 327/147; 327/156; 702/69
(58) Field of Classification Search ................... 375/224, 375/226, 371, 376, 227, 373, 375; 455/516, 455/260; 327/141, 156, 147; 702/69
See application file for complete search history.

(56) References Cited

U.S. PATENT DOCUMENTS

| | | | |
|---|---|---|---|
| 6,295,315 B1 | 9/2001 | Frisch et al. | |
| 6,396,889 B1 | 5/2002 | Sunter et al. | |
| 6,661,860 B1 | 12/2003 | Gutnik et al. | |
| 6,670,800 B2 | 12/2003 | Beach et al. | |
| 6,829,295 B2 | 12/2004 | Chao et al. | |
| 6,841,985 B1 | 1/2005 | Fetzer | |
| 6,850,051 B2 | 2/2005 | Roberts et al. | |
| 7,024,324 B2 * | 4/2006 | Rifani et al. | 702/79 |
| 7,564,284 B2 * | 7/2009 | Henzler et al. | 327/261 |
| 2009/0112499 A1 * | 4/2009 | Chao et al. | 702/69 |

OTHER PUBLICATIONS

Website: www.credence.com.
P. Dudek et al., "A High-Resolution CMOS Time-to-Digital Converter Utilizing a Vernier Delay Line" in Proc. IEEE J. Solid-State Circuits, vol. 35, pp. 240-247, Feb. 2000.
S. Sunter et al., "BIST for Phase-Locked Loops in Digital Applications" in Proc. IEEE Int. Test Conf., 1999, pp. 251-540.
H. Lin et al., "CMOS Built-in Test Architecture for High-Speed Jitter Measurement" in Proc, IEEE Int. Test Conf., 2003.
A. H. Chan et al., "A Synthesizable, Fast and High-Resolution Timing Measurement Device Using a Component-Invarian Vernier Delay Line" in Proc. IEEE Int. Test Conf., 2001, pp. 858-867.

* cited by examiner

*Primary Examiner* — Leon Flores
(74) *Attorney, Agent, or Firm* — Bacon & Thomas, PLLC

(57) ABSTRACT

The present invention relates to a jitter measuring system, comprising: a delay circuit for receiving a clock signal and delaying the clock signal to generate a delay signal; a jitter amplifier for receiving the clock signal and delay signal to generate a first signal and a second signal; and a converter for converting a phase different between the first signal and the second signal into a relevant digital code; wherein the phase difference between the first signal and the second signal is an amplification of jitter.

12 Claims, 13 Drawing Sheets

| SUT | SUT$_d$ | S$_1$ | S$_2$ | S$_3$ | V$_1$ charging rate | V$_2$ charging rate |
|---|---|---|---|---|---|---|
| 0 | 0 | OFF | OFF | OFF | 0 | 0 |
| 1 | 0 | ON | ON | OFF | (1+n)xL | 0 |
| 1 | 1 | OFF | ON | ON | 1xL | 1xL |
| 0 | 1 | OFF | OFF | ON | 0 | 1xL |

Fig. 4

JITTER MEASURING SYSTEM AND METHOD

BACKGROUND OF THE INVENTION

The present invention relates to a jitter measuring system and a method thereof.

Measuring timing jitter is a challenge common to the design of high-speed systems. In the old days the demand is not high, since most systems are designed to transmit signals in low speed to avoid this problem. As a result, the requirement for jitter measurement is not high. For example, if the jitter ratio is 5% and the clock operation frequency is 100 MHz, jitter is 500 ps. In such a case the requirement for jitter measurement is not stringent. However, as IC technology, digital technology, computer usage, and the demand for communication bandwidth progress, all sorts of protocols now require faster speed and broader bandwidth. Under these new protocols, how to accurately measuring timing jitter becomes an important issue. For example, for a same 5% jitter ratio in 10 GHz clock signal, the jitter is required to be 5ps.

Currently, jitter measurement is done using external instruments. However, measuring cost and accuracy become problems as the system operational speed increases. When measuring a high frequency signal (GHz) by oscilloscopes, in order to obtain accurate results, the sampling rate needs to be high, say often greater than 10 GS/s, and special software and hardware are needed. High speed oscilloscopes often cost tens of thousands US dollars or more. Also, using external devices to measure signals inside chips may run the risk of accuracy diminishing. For instances, interference caused by the measuring environment, limitation of the bandwidth of the I/O interface, and noise from output buffers of the chips are all causes that may reduce accuracy.

Although timing jitter is defined as the amount of phase shift, measuring definitions may vary for different applications. For example, period jitter is defined as the amount of phase shift between a real clock period and an ideal period, cycle-to-cycle jitter characterizes the time difference between two adjacent clock periods, and long-term jitter represents the accumulated period jitter after n periods. These three jitter definitions are commonly found in the system specifications regulated by the industry and are applied to specifications with different speeds. As an example, period jitter and long-term jitter are mostly applied to regulate timing margin in low speed systems. If setup-time is less than period jitter, system error may occur because there is not enough time to retrieve data; the specification sets the maximum tolerable limit for this. However, with the increase in clock speed, a system clock may be distributed to different circuits, and any tiny change in every period may affect the system. For example, delay locked loop (DLL) is often used for de-skewing clock, and if the jitter of reference clock exceeds the tracking frequency of the loop, the loop may be unlocked and system error appears. Therefore, cycle-to-cycle jitter is usually regulated in high speed clock jitter measurement. Also, period jitter and long-term jitter can be measured by using a digital story oscilloscope (DSO) to fix the rising edge and falling edge at one point and to accumulate the waves. On the other hand, due to the irregular nature of cycle-to-cycle jitter, there is no reference point for measurement. Making an effort to measure jitter between two subsequent clock cycles requires extremely fast sampling rate, and is very costly.

Currently, jitter measurement are done using time analysis method. Although there are different frameworks for doing this, these frameworks all are based on the concept of Time-to-Digital Conversion. However, there are some common problems in these frameworks, namely slow operational speed and low resolution. PC peripherals available on the market mostly are in the MHz range. As for CPUs and I/O interfaces, these are in the GHz range. Specification of jitter in high-speed systems is defined in tens of picoseconds, if the measuring devices lacked resolution and bandwidth, the measured signals cannot be verified.

Referring to FIG. 13. FIG. 13 is a diagram of a known Time-to-Digital Conversion circuit for measuring jitter. When jitter occurs in a clock signal SUT, its edge would drift away from its ideal place. The common way is to delay the SUT one period ($SUT_d$) and measure the jitter of each period edge. This is done by sending the SUT into a delay chain as sample data, and the $SUT_d$ is the sampled clock. $SUT_d$ will generate digital information, which resembles thermal-meter codes when sampling SUT's with different delay amounts, and this digital information represents measured jitter value. For example, if the delay chain is made of 10 delay units with a delay amount of 25-ps and the clock period jitter is 10-ps, the sampling result is [Q1:Q10]=1000000000. When the jitter is 30-ps, [Q1:Q10]=110000000. Basically, when jitter increases, the 1's in the digital information increase.

As discussed above, because resolution and delay amount of the delay unit are inversely proportioned, unless the delay amount is designed to be small, errors would occur. According to the example given above, ideally, when jitter is either 0.1-ps or 24.9-ps, the digital values both are [Q1:Q10]=10000000000 and its maximum error is close to delay time of one delay buffer. This kind of error may induce quantization error especially when testing in high speed and low jitter application. One may try to shorten the delay time to reduce error by enhancing the circuit boards, but this is difficult due to manufacturing limitations and requires more hardware spaces.

SUMMARY OF THE INVENTION

The exemplary embodiment of the current invention provides a jitter measuring system, comprising: a delay circuit, for receiving a clock signal and delaying the clock signal to generate a delay signal; a jitter amplifier, for amplifying the received clock signal and delay signal to generate a first signal and a second signal; and a converter, for converting the phase difference between the first signal and the second signal into a digital value; wherein the phase difference between the first signal and the second signal is the amplified value of input jitter of the clock signal.

Another exemplary embodiment of the current invention also provides a jitter measuring method, comprising: receiving a clock signal; generating a delay signal according to the clock signal; generating a first signal and a second signal according to the clock signal and the delay signal; and determining the phase difference between the first signal and the second signal; wherein the phase difference between the first signal and the second signal is an amplified amount of the jitter value of the clock signal.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 4 is a table showing the correlations of the switches of the charging circuits.

DETAILED DESCRIPTION OF THE INVENTION

Figure 1:
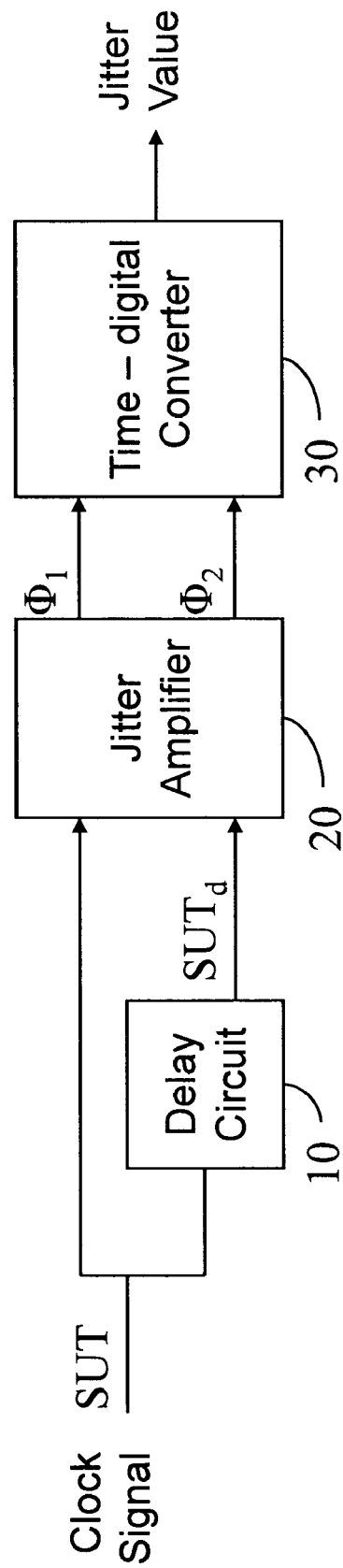
FIG. 1 shows an exemplary jitter measurement system schematic in accordance with an embodiment of the current invention.

The current invention discloses a jitter measurement system and method for measuring clock jitter. FIG. 1 shows a jitter measurement system schematic in accordance with an embodiment of the current invention. The jitter measurement system of the embodiment is for measuring the cycle-to-cycle jitter of a clock signal. The jitter measurement system comprises a delay circuit 10, a jitter amplifier 20, and a converter 30.

The delay circuit 10 is for receiving a clock signal SUT and for delaying the clock signal SUT to generate a delay signal $SUT_d$. In a preferred embodiment of the current invention, the delay signal $SUT_d$ is delayed by one cycle relative to the clock signal SUT. The jitter amplifier 20 is for receiving the clock signal SUT and the delay signal $SUT_d$ to generate a first signal $\Phi_1$ and a second signal $\Phi_2$. The converter 30 converts the first signal $\Phi_1$ and the second signal $\Phi_2$ to find the clock signal SUT jitter.

Figure 2:
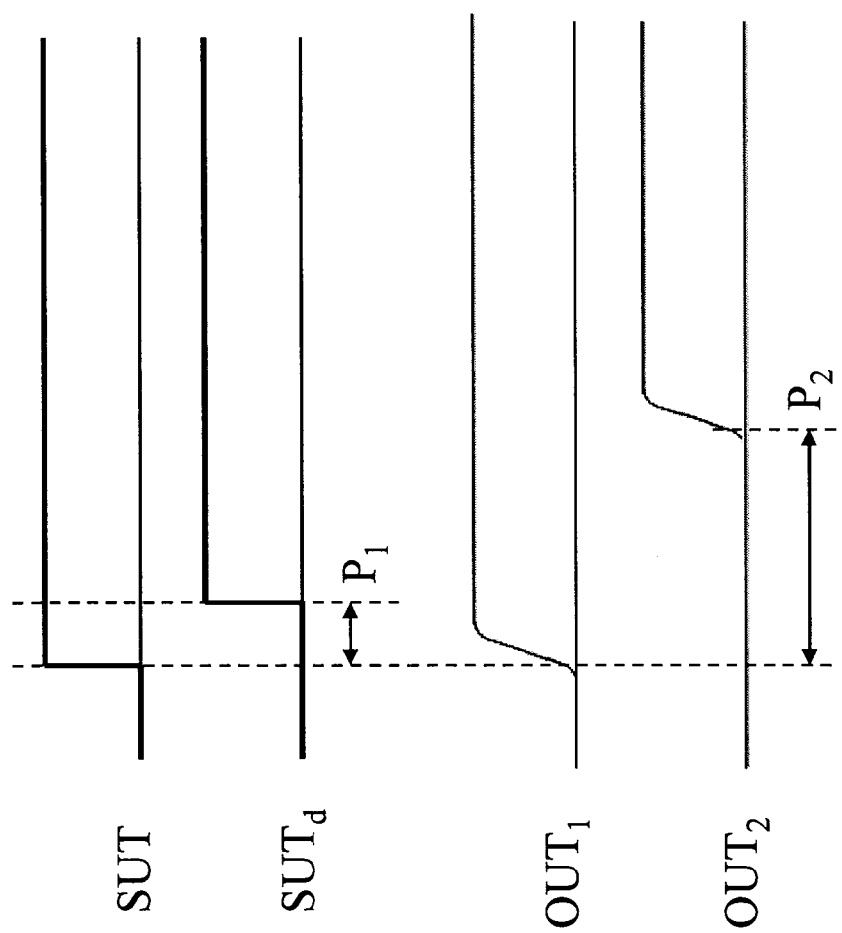
FIG. 2 shows the signal waveforms of a jitter measurement system in accordance with an embodiment of the current invention.

FIG. 2 shows the signal waveforms of the jitter measurement system. The phase difference $P_1$ between the clock signal SUT and the delay signal $SUT_d$ is the jitter of the clock signal SUT, and the phase difference $P_2$ between the first signal $\Phi_1$ and the second signal $\Phi_2$ is K times to the phase difference $P_1$, or K times the jitter of the clock signal SUT. The converter 30 converts the first signal $\Phi_1$ and the second signal $\Phi_2$ to find the phase difference $P_2$, which is the amplified jitter of the clock signal SUT. The jitter measurement system can thus measure the original jitter of the clock signal SUT with improved resolution by 1/K.

Accordingly, the jitter measurement system of the current invention measures jitter by amplifying the phase difference (jitter) of the clock signal SUT using the jitter amplifier 20 to get an amplified phase difference for a more accurate measurement result of the original jitter of the clock signal SUT.

The jitter amplifier 20 controls a plurality of electric current sources to charge different loads according to the detected triggering times of the clock signal SUT and the delay signal $SUT_d$. The first signal $\Phi_1$ and the second signal $\Phi_2$ are defined according to the charging rates of different loads, and the amplification of jitter is achieved by the phase difference $P_2$ between the first signal $\Phi_1$ and the second signal $\Phi_1$.

Figure 3:
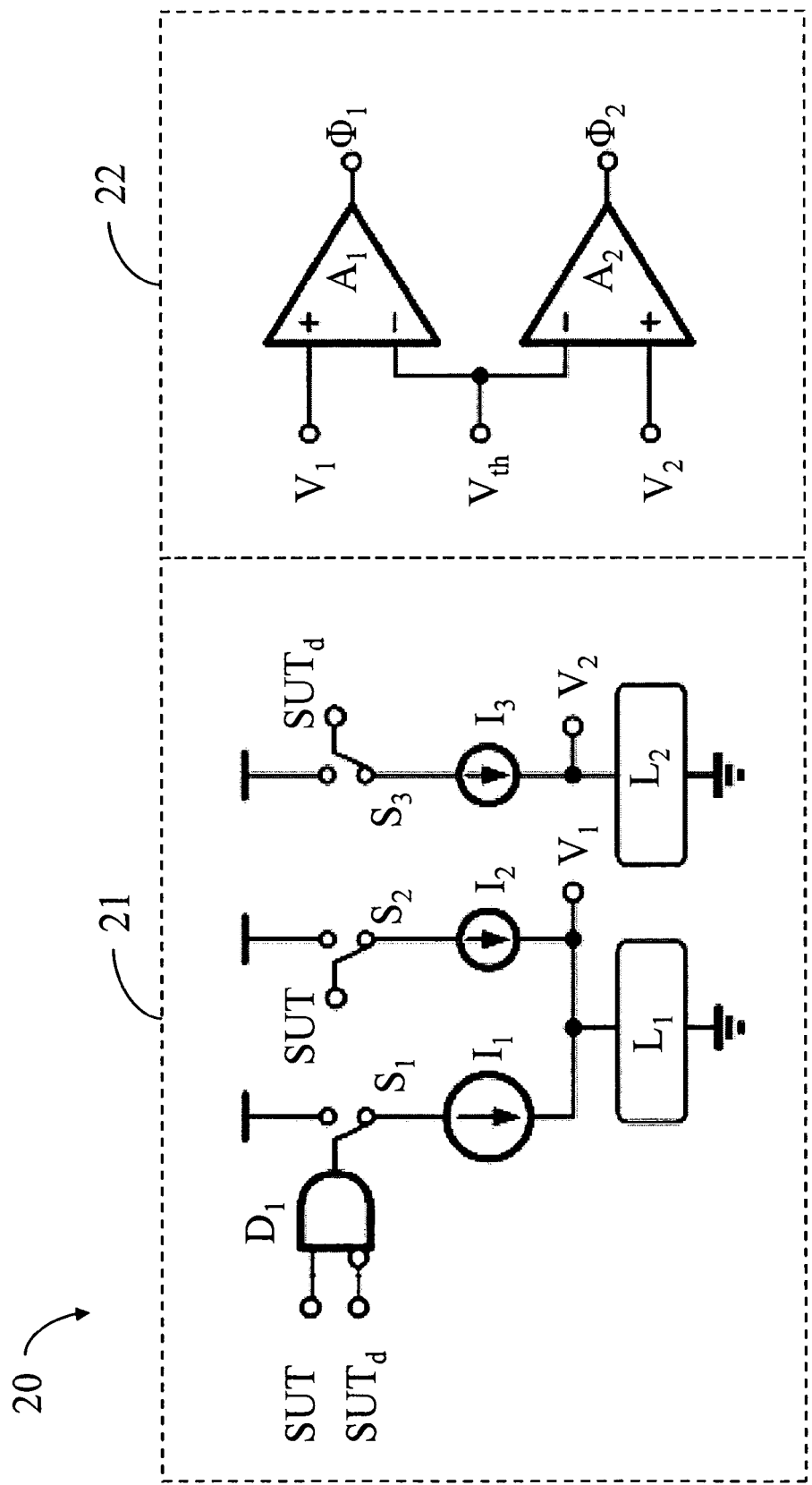
FIG. 3 shows an exemplary jitter amplifying circuit in accordance with an embodiment of the current invention.

FIG. 3 shows a jitter amplifier 20 schematic in accordance with an embodiment of the current invention. The jitter amplifier 20 comprises a charging circuit 21 and a control circuit 22. The charging circuit 21 receives the clock signal SUT and the delay signal $SUT_d$ and generates a set of the reference voltages $V_1$ and $V_2$, and the control circuit 22 receives the reference voltages $V_1$ and $V_2$ to generate the first signal $\Phi_1$ and the second signal $\Phi_2$.

The charging circuit 21 comprises two electric current sources $I_1$ and $I_2$ for charging a load $L_1$ to generate the reference voltage $V_1$ and comprises one electric current source $I_3$ for charging a load $L_2$ to generate the reference voltage $V_2$. $V_{th}$ is a predetermined threshold voltage. Electric current sources $I_2$ and $I_3$ output the same current L and electric current source $I_1$ outputs current nL, where $n=I_1/I_2=I_1/I_3$. The charging circuit 21 further comprises a switch $S_1$, which receives the clock signal SUT and an inverted signal of the delay signal $SUT_d$ through an AND Gate $D_1$, a switch $S_2$, which receives the clock signal SUT, and a switch $S_3$, which receives the delay signal $SUT_d$. Switch $S_1$, $S_2$, and $S_3$ are for controlling the passage of electric current sources $I_1$, $I_2$, and $I_3$ respectively.

The control circuit 22 comprises two comparators $A_1$ and $A_2$. The comparator $A_1$ compares the reference voltage $V_1$ and the threshold voltage $V_{th}$ and outputs the first signal $\Phi_1$. The comparator $A_2$ compares the reference voltage $V_2$ with the threshold voltage $V_{th}$ and outputs the second signal $\Phi_2$.

FIG. 4 is a table showing the correlations of the switches $S_1$, $S_2$, and $S_3$. The correlations of the switches $S_1$, $S_2$, $S_3$ are described as below.

When the clock signal SUT and the delay signal $SUT_d$ both are not triggered at low voltage levels, the switches $S_1$, $S_2$, and $S_3$ are switched off. This results in the electric current sources $I_1$, $I_2$, and $I_3$ not able to the charge the loads $L_1$ and $L_2$. Hence the reference voltages $V_1$ and $V_2$ are low.

When the clock signal SUT is triggered and at a high voltage level, while the delay signal $SUT_d$ remains at a low voltage level, the switches $S_1$ and $S_2$ are turned on, and the switch $S_3$ is turned off. The load $L_1$ is charged by electric current sources $I_1$ and $I_2$ at a rate of (1+n)L and the reference voltage $V_1$ increases. The reference voltage $V_2$ remains low.

When the clock signal SUT and the delay signal $SUT_d$ are both triggered and at high voltage levels, the switches $S_2$ and $S_3$ are switched on and the switch $S_1$ is switched off. The loads $L_1$ and $L_2$ are charged by electric current sources $I_2$ and $I_3$ respectively at a rate of 1L and the reference voltages $V_1$ and $V_2$ increase at the same rate.

When the clock signal reaches its negative edge and is at low voltage level while the delay signal $SUT_d$ remains at high voltage level, the switches $S_1$ and $S_2$ are turned off and the switch $S_3$ is on. The the load $L_2$ is continually charged by electric current source $I_3$ at a rate of 1L to pull up the reference voltage $V_2$. The reference voltage $V_1$ returns to a low voltage level.

Figure 5:
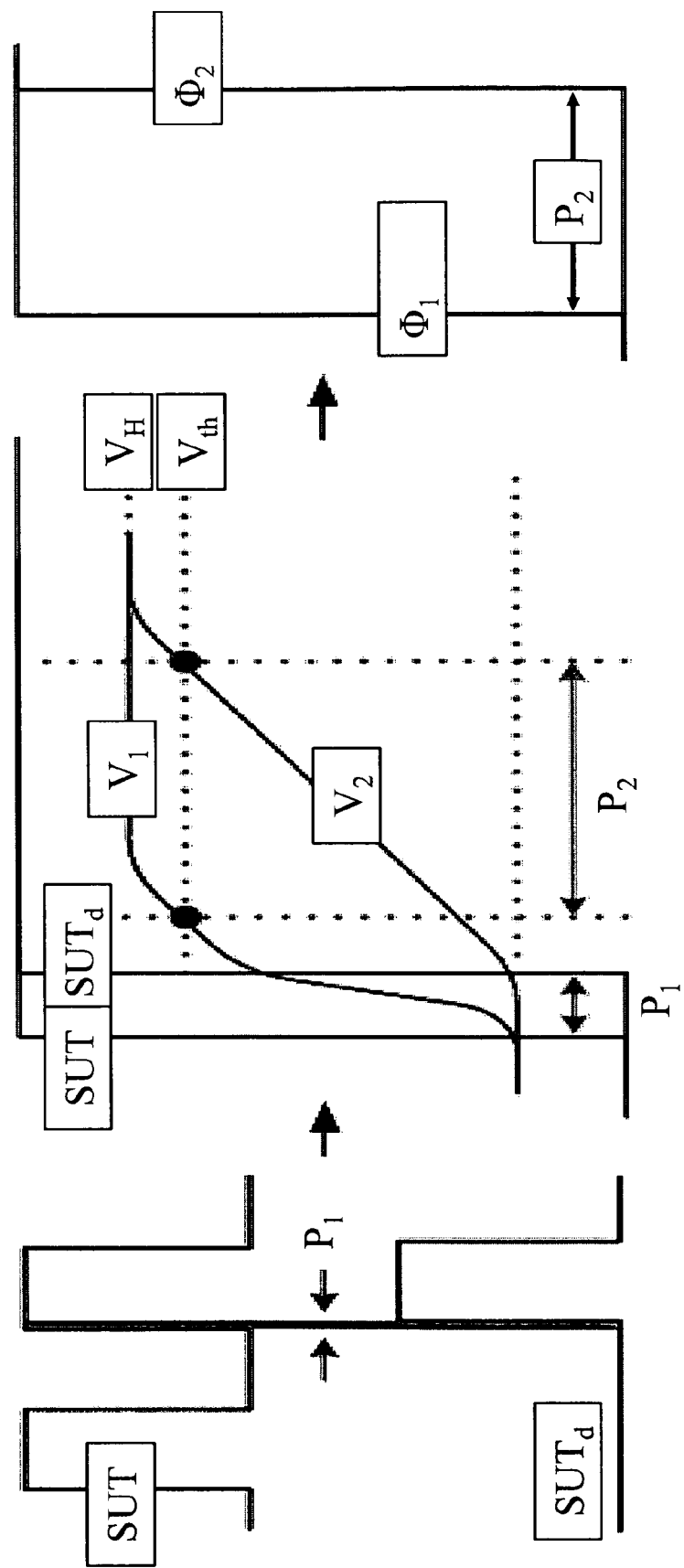
FIG. 5 shows the correlation of the signals of the jitter amplifying circuit.

The above description of the charging circuit 21 helps to clarify the relationship between the first signal and the second signal outputted by the jitter amplifier 20. FIG. 5 shows the signal correlations of the jitter amplifier 20. $V_H$ is the voltage at high stabilizing level. As shown, the delay signal is generated by delaying the clock signal by one cycle. Due to jitter, the clock signal in the second cycle is triggered earlier or latter than the delay signal by $\Delta T$, and there occurs a phase difference $P_1$ between the clock signal SUT and the delay signal $SUT_d$. The timing of when the reference voltages $V_1$ and $V_2$ each reach the threshold voltage $V_{th}$ can be obtained by obtaining the loads $L_1$ and $L_2$.

The reference voltage $V_1$ initially increases at the rate of $(1+n)L$ for a time period, $\Delta T$. When the delay signal $SUT_d$ also reaches high voltage level, the reference voltages $V_1$ and $V_2$ both increase at the rate of $1L$. Therefore, when the reference voltage $V_1$ reaches the high stabilizing level $V_H$, the reference voltage $V_2$ still needs $(1+n)L\Delta T$ amount of time to reach $V_H$.

Referring to the schematic of the control circuit 22 (FIG. 3), the comparator $A_1$ outputs the first signal $\Phi_1$ to be high level voltage or low level voltage by comparing the reference voltage $V_1$ with the threshold voltage $V_{th}$, and the comparator $A_2$ outputs the second signal $\Phi_2$ to be high level voltage or low level voltage by comparing the reference voltage $V_2$ with the threshold voltage $V_{th}$. The clock signal SUT and the delay signal $SUT_d$ are triggered by $\Delta T$ apart. The time difference between when the reference voltage $V_1$ reaches $V_H$ and the reference voltage $V_2$ reaches $V_H$ is $(1+n)\Delta T$, which means $\Phi_2$ is triggered after $\Phi_1$ by $(1+n)\Delta T$. The phase difference $P_2$ between $\Phi_1$ and $\Phi_2$ is therefore $(1+n)P_1$. The amplification $K=(1+n)$.

Therefore, by lowering the currents of the electric current sources $I_1$, $I_2$, and $I_3$, the charging slope of loads $L_1$ and $L_2$ is lowered, and the jitter between the clock signal SUT and the delay signal $SUT_d$ is amplified. The phase difference $P_1$ between the clock signal SUT and the delay signal $SUT_d$ is amplified, and the amplified phase difference $P_2$ is measured and converted back to obtain the phase difference $P_1$.

Figure 6:
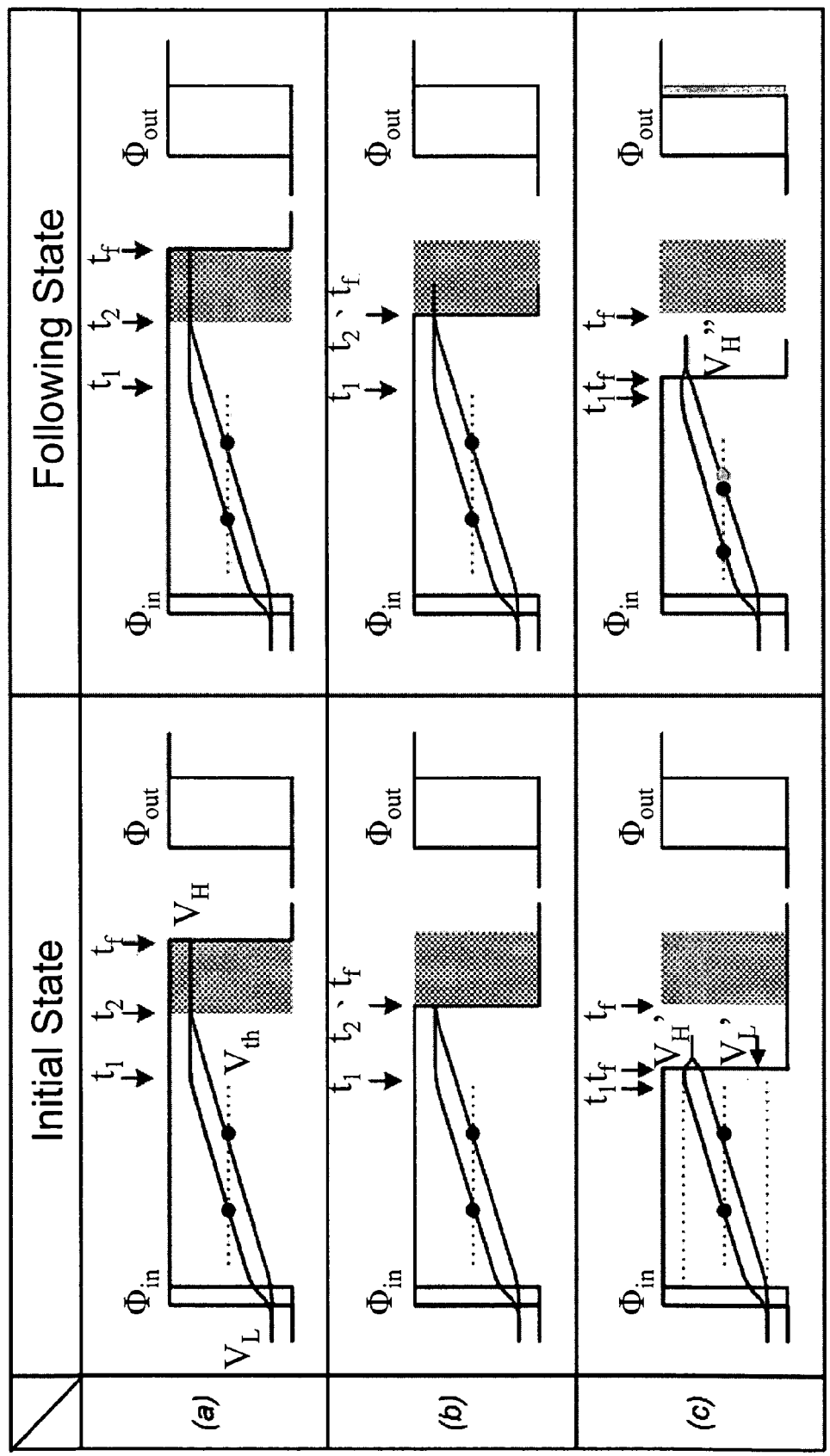
FIG. 6 shows the time sequences of the jitter amplifying circuit.

Because the jitter amplifier 20 amplifies jitter by the charging rate of the currents, the jitter amplifier 20 operating under high frequencies will amplify non-linearly and lost resolution. Referring to FIG. 6, which shows the time sequences of the jitter amplifier 20, part (a) is when the jitter amplifier 20 operates under low frequency, part (b) is when the jitter amplifier 20 operates under threshold frequency, and part (c) is when the jitter amplifier 20 operates under high frequency. $V_H$ and $V_L$ are high level and low level stabilizing voltages respectively. $t_1$ and $t_2$ are the time for the reference voltages $V_1$ and $V_2$ take to reach the high stabilizing level. $t_f$ is the time for the clock signal SUT takes to reach its negative edge. The periods between $t_1$, $t_2$ to $t_f$ is called the steady-state zone.

Referring to part (a) of FIG. 6, when the jitter amplifier 20 is operating under low frequency, jitter is less than half of a cycle and the time, $t_1$ and $t_2$, for the reference voltages take to reach the high level stabilizing voltage $V_H$ are less than $t_f$. As a result, the ratio of the phase difference $P_2$ of the first signal $\Phi_1$ and the second signal $\Phi_2$ outputted by the control circuit 22 to $P_1$ can be maintained. In other words, the amplification $K$ of the jitter amplifier 20 is constant.

Referring to part (b) of FIG. 6, when the cycle of the clock signal SUT is reduced, the time it takes to reach negative edge $t_f$ shortens, and if $t_f$ is close to the time it takes for the reference voltage $V_2$ to reach high stabilizing level, $t_2$, the jitter amplifier 20 is able to maintain its amplification, but the operating frequency can not be higher. This operating frequency is called the threshold operating frequency.

Referring to part (c) of FIG. 6, when the operating frequency exceeds the threshold operating frequency, as a result, $t_f$ is shorter than $t_2$, and then the amplification of the jitter amplifier 20 becomes non-linear as $t_f$ rises before the reference voltages $V_1$ and $V_2$ reaching $V_H$. When $t_f$ rises before $t_2$, the reference voltages $V_1$ and $V_2$ are constrained by new voltage levels $V_H'$ and $V_L'$, and the timing of the reference voltages $V_1$ and $V_2$ reaching stabilizing voltage will change in the next cycle due to the new reference point $V_L'$ of the reference voltages $V_1$ and $V_2$. As a result, the phase difference $P_2$ changes.

Figure 7:
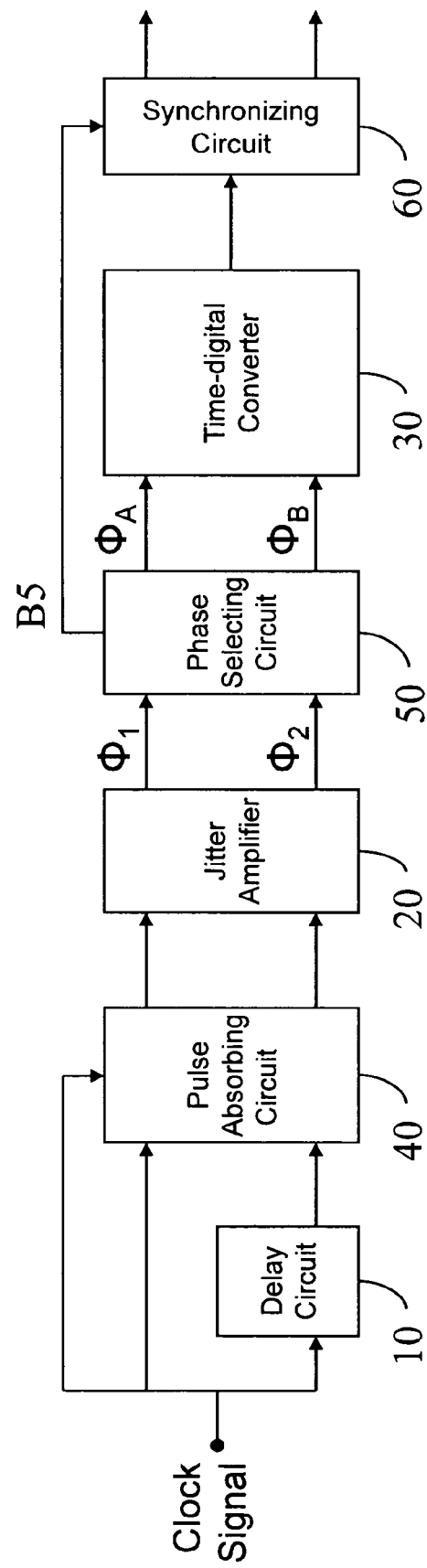
FIG. 7 shows an exemplary jitter measurement system schematic in accordance with detailed embodiment of the current invention.

FIG. 7 is the schematic of the exemplary jitter measurement system in accordance with another embodiment of the current invention. In the current embodiment, the reference voltage $V_2$ is able to reach the high level stabilizing voltage $V_H$ before the time to reach negative edge $t_f$. The problem of non-linear amplification is thus resolved. The jitter measurement system comprises all the elements listed in FIG. 1 and further comprises a pulse absorbing circuit 40, a phase selecting circuit 50, and a synchronizing circuit 60.

The pulse absorbing circuit 40 is connected to the jitter amplifier 20 and amplifies the clock signal SUT. The phase selecting circuit 50 is for determining the relationship between the first signal $\Phi_1$ and the second signal $\Phi_2$ received and generating a measuring clock $\Phi_A$ and a sample clock $\Phi_B$ to the converter 30 for jitter measurement. The synchronizing circuit 60 synchronizes the signals received for software and hardware analysis later on.

Figure 8:
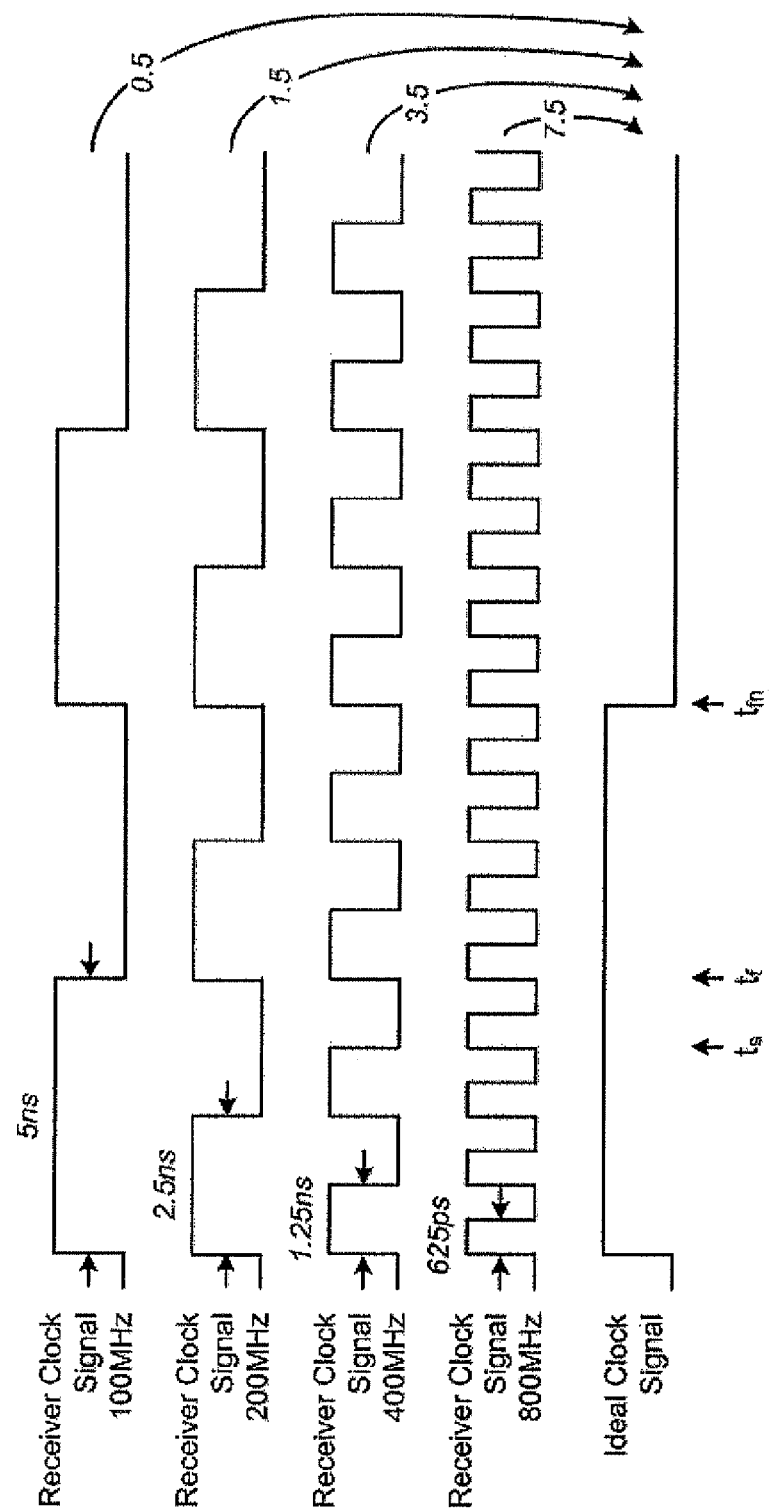
FIG. 8 shows pulse absorption of a pulse absorbing circuit.

The pulse absorbing circuit 40 delays $t_f$ to maintain the amplification of the jitter amplifier 20 under different operating frequencies. Referring to FIG. 8, the pulse absorbing circuit 40 removes 0.5 cycle of the received clock signal when the frequencies of the clock signal SUT and the delay signal $SUT_d$ are 100 MHz, $t_f$ is delayed to increase the steady-state zone so the received clock signal becomes an ideal clock signal. As the operating frequency of the received clock signal increases, the number of cycles removed by the pulse absorbing circuit 40 is increased to maintain the received clock signal ideal.

The phase selecting circuit 50 determines the relationship between the first signal $\Phi_1$ and the second signal $\Phi_2$, and selects the leading signal to be the measurement signal $\Phi_A$ and the lagging signal to be the sample signal $\Phi_B$.

As jitter of the clock signal SUT increases, jitter may be measured directly and the need of amplifying may no longer exist. The current invention further comprises a threshold circuit for determining whether amplification is needed.

Figure 9:
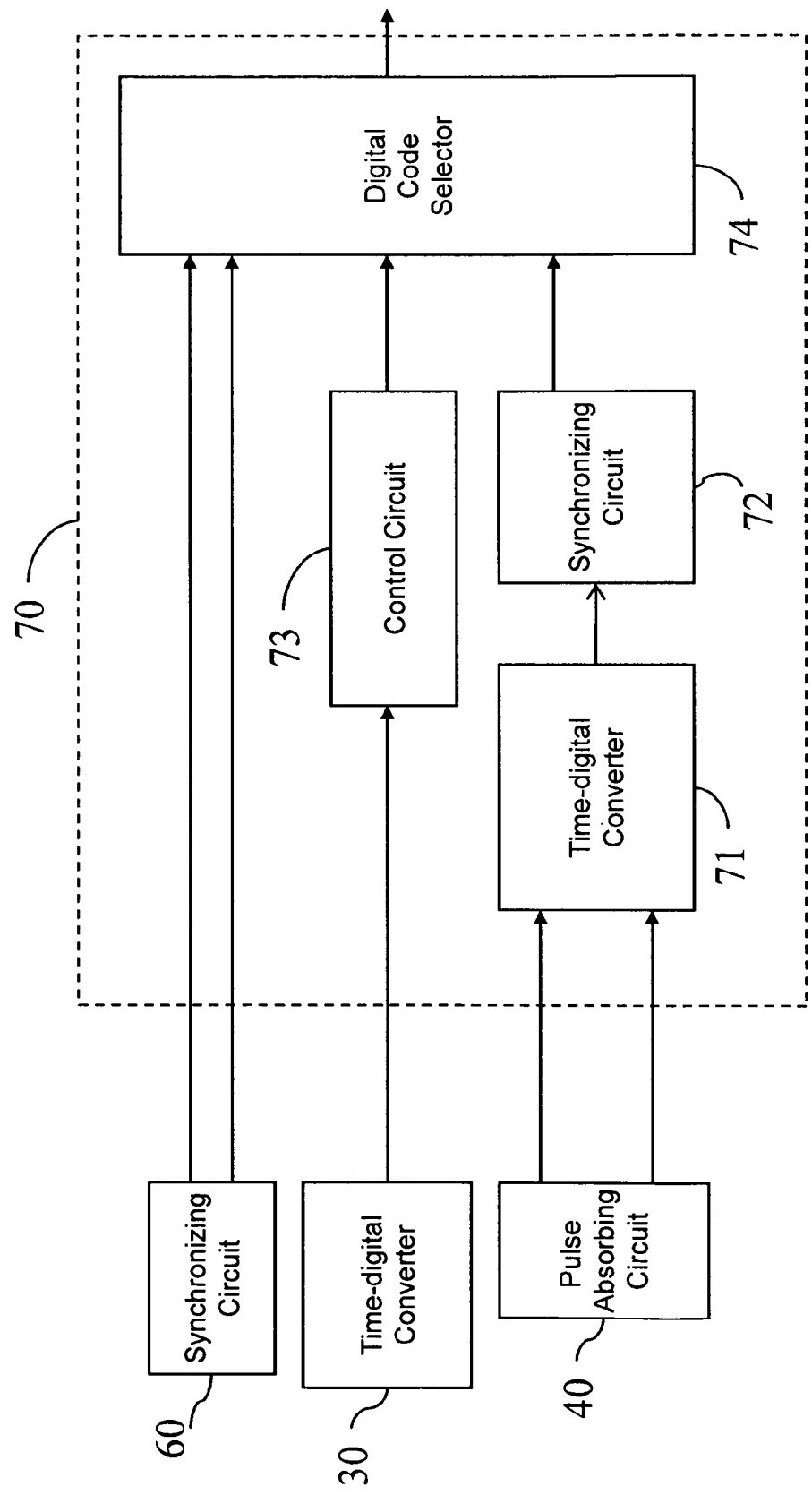
FIG. 9 shows an exemplary threshold circuit in accordance with an embodiment of the current invention.

FIG. 9 is an exemplary threshold circuit 70 in accordance with an embodiment of the current invention. The threshold circuit 70 comprises a converter 71, a synchronizing circuit 72, a control circuit 73, and a digital code selector (DCS) 74.

The converter 71 is a traditional time-digital converter for receiving the ideal clock signal SUT generated by the pulse absorbing circuit 40 and the delay signal $SUT_d$. The control circuit 73 is for receiving the jitter quantized by the converter 30 and determining whether to use the converter 71 to measure jitter. When the digital output code of the jitter amplification 20 is fully loaded, the threshold circuit 70 switches to the output of the time-digital converter 71 and the digital value selector 74 determines the current output data based on the jitter and data generated by the synchronizing circuit 60. As a result, the time and cost for measurement are reduced.

Figure 10:
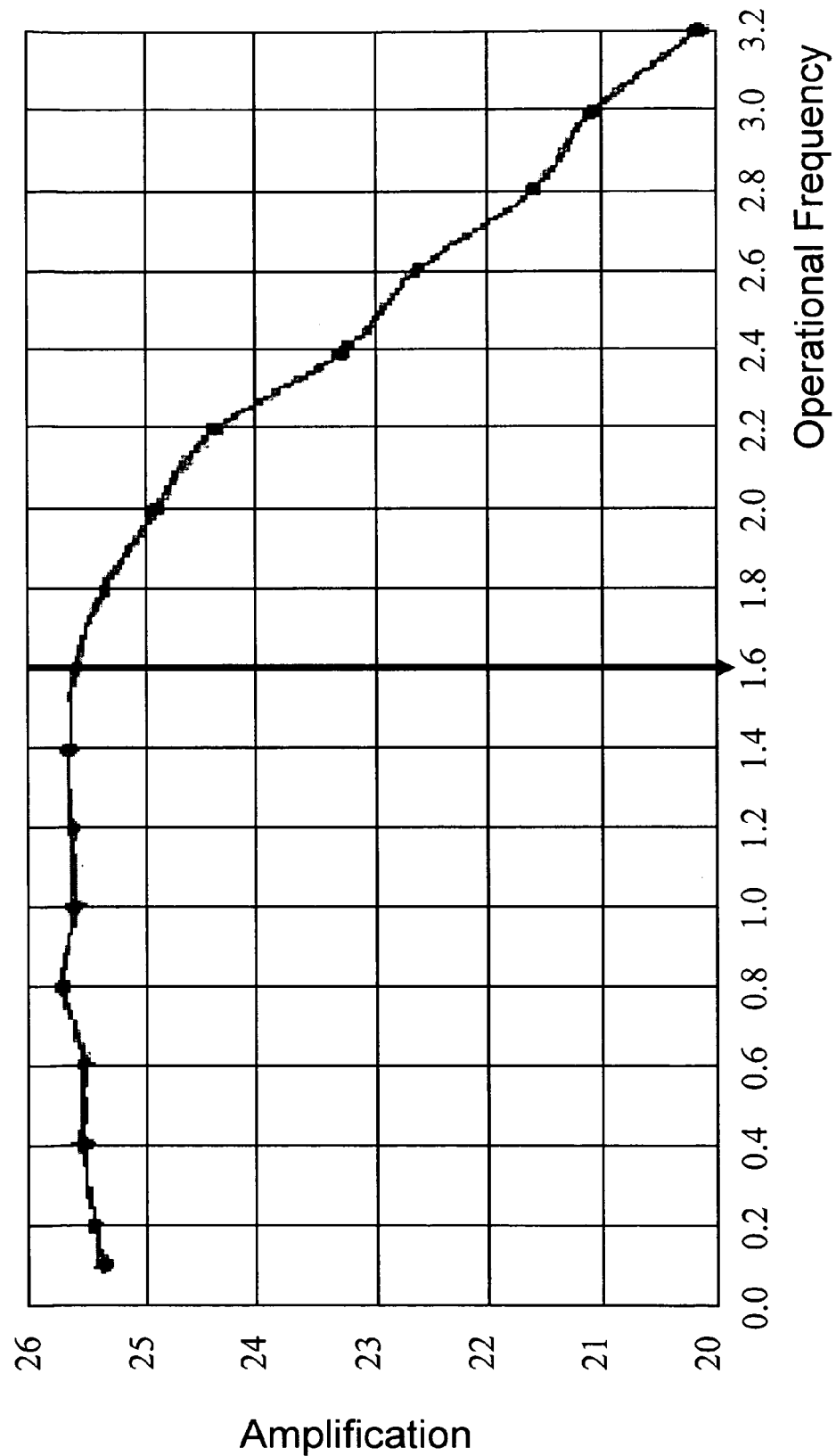
FIG. 10 shows the amplification of the jitter amplifier under different operating frequencies in accordance with an embodiment of the current invention.

FIG. 10 shows the relationship between amplification of the jitter amplifier and the operating frequency in accordance with an embodiment of the current invention. The pulse absorbing circuit 40 absorbs different number of cycles of the received clock signal when operating under different frequencies, and hence creates enough steady-state zone for the jitter amplifier 20. As shown, when the clock signal is operating under 1.6 GHz, the amplification of the jitter amplifier 20 is kept at around 25.5 times. When the clock signal is operating above 1.6 GHz, the time it takes for the clock signal to reach negative edge gets closer to the threshold time of the received clock signal and the amplification of the jitter amplifier 20 starts to decrease. As the operating frequency of the received clock signal continues to increase, the time to reach negative edge happens before the threshold time and the amplification of the jitter amplifier decreases sharply. Therefore, in the current embodiment, the amplification of the jitter amplifier remains constant when operating between tens of MHz to 1.6 GHz, and the number of cycles to be removed by the pulse absorbing circuit 40 can be set above 1.6 GHz.

Figure 11:
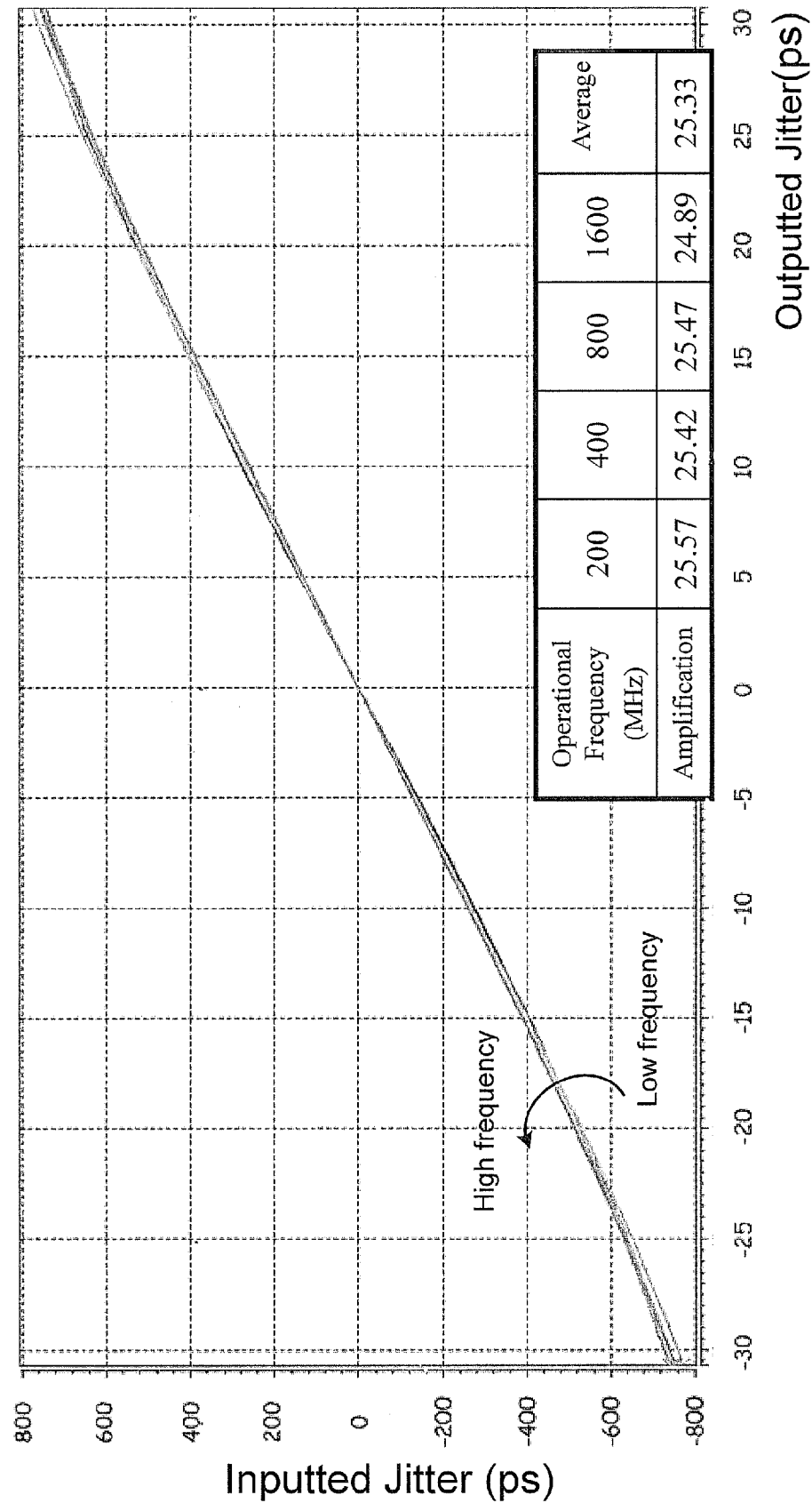
FIG. 11 shows the transfer curve between original jitter and amplified jitter in accordance with an embodiment of the current invention.

FIG. 11 shows the relational curve between original jitter and amplified jitter in accordance with an embodiment of the current invention. As shown, the jitter amplifier consistently amplifies jitter whether when operating under low frequency or high frequency.

Figure 12:
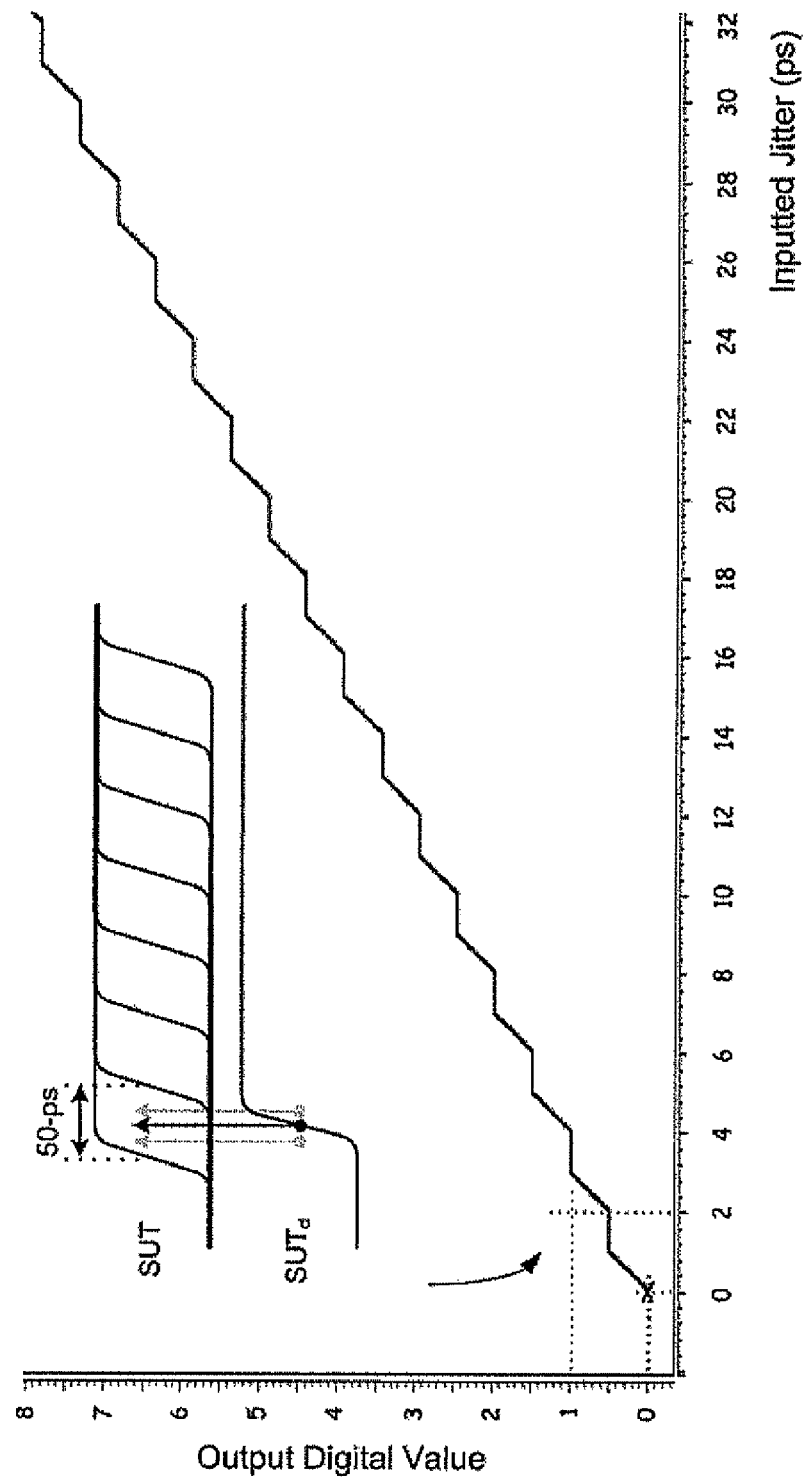
FIG. 12 shows the relationship between clock signals and their corresponding digital values in accordance with an embodiment of the current invention.
Figure 13:
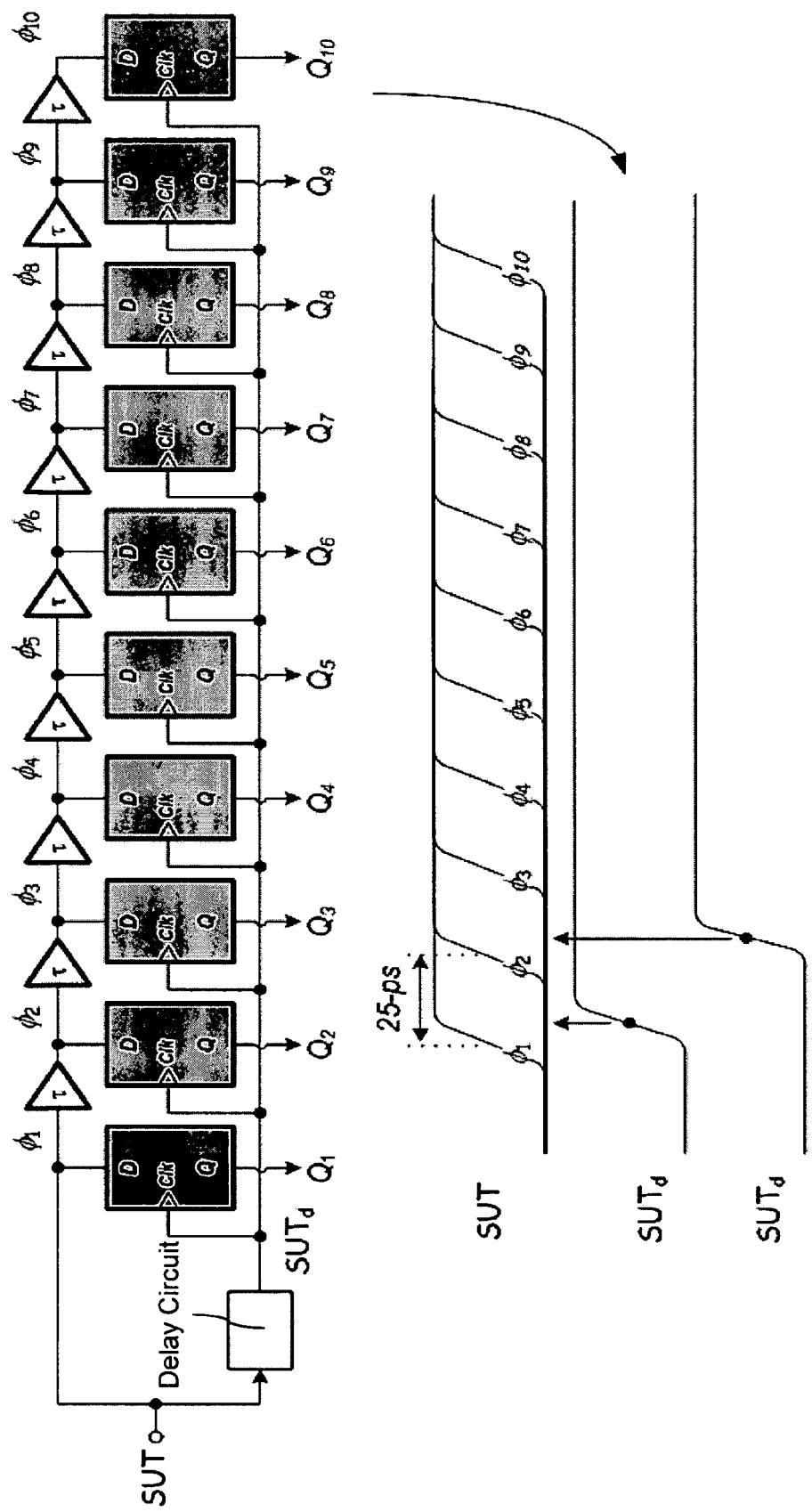
FIG. 13 shows time-digital conversion circuit of a known jitter measuring method.

FIG. 12 shows the relationship between clock signals SUT and their corresponding quantization digital codes in accordance with an embodiment of the current invention. As shown, the ratio between the amplification of the jitter amplifier 20 and the delay time of the delay circuit 10 is 25:50 (1:2). Under this condition, the best resolution that can be measured is 50/25=2 ps, which means the digital codes vary once every 2 ps. The resolution may be changed by changing the amplification of the jitter amplifier 20 or the delay time of the delay circuit 10.

High resolution measurement of jitter is measured by amplifying the received clock signal in the current invention. By utilizing the pulse absorbing circuit, the steady-state zone is increased to obtain constant amplification and reduce measurement errors caused by frequency changes.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A jitter measuring system, comprising:
   a delay circuit for receiving a clock signal and delaying the clock signal to generate a delay signal;
   a jitter amplifier for receiving the clock signal and the delay signal to generate a first signal and a second signal; and
   a converter for converting a phase difference between the first signal and the second signal into a digital value;
   wherein the phase difference between the first signal and the second signal is an amplified amount of a jitter value of the clock signal; and
   wherein the jitter amplifier comprises a first electric current source, a second electric current source, a third electric current source, a first load, and a second load, wherein the first electric current source and the second electric current source charge the first load to generate a first reference voltage, and the third electric current source charges the second load to generate a second reference voltage.

2. The jitter measuring system of claim 1, wherein when the currents of the first, second, and third electric current sources are varied, the charging rates of the respective first and second loads are varied, and the jitter value between the clock signal and the delay signal is amplified.

3. The jitter measuring system of claim 1, wherein the first signal and the second signal are generated by comparing the first reference voltage and the second reference voltage with a base voltage respectively.

4. The jitter measuring system of claim 1, wherein the first electric current source is triggered by an inverted signal of the delay signal combined with the clock signal, the second electric current source is triggered by the clock signal, and the third electric current source is triggered by the delay signal.

5. A jitter measuring system, comprising:
   a delay circuit for receiving a clock signal and delaying the clock signal to generate a delay signal;
   a jitter amplifier for receiving the clock signal and the delay signal to generate a first signal and a second signal;
   a converter for converting a phase difference between the first signal and the second signal into a digital value;
   wherein the phase difference between the first signal and the second signal is an amplified amount of a jitter value of the clock signal; and
   a pulse absorbing circuit for receiving the clock signal and the delay signal, and generates an ideal clock signal and an ideal delay signal respectively to the jitter amplifier.

6. The jitter measuring system of claim 5, wherein the pulse absorbing circuit removes parts of the cycles of the clock signal and the delay signal to increase the cycles of the clock signal in response to a variation of operating frequency thereof and generates the ideal clock signal and the ideal delay signal.

7. The jitter measuring system of claim 5, further comprising a threshold circuit for receiving and transmitting the ideal clock signal and the ideal delay signal to the jitter amplifier, wherein the threshold circuit detects a phase difference between the ideal clock signal and the ideal delay signal.

8. The jitter measuring system of claim 7, wherein the threshold circuit further comprises a control circuit, and the control circuit stops transmitting the ideal clock signal and the ideal delay signal to the jitter amplifier when the phase difference between the ideal clock signal and the ideal delay signal is greater than a predetermined value.

9. A method for measuring jitter, comprising:
   receiving a clock signal;
   generating a delay signal in response to the clock signal;
   generating a first signal and a second signal in response to the clock signal and the delay signal; and
   determining a phase difference between the first signal and the second signal;
   wherein the phase difference between the first signal and the second signal is an amplified amount of a jitter value of the clock signal;
   wherein a plurality of loads are charged by triggering a plurality of electric current sources with the clock signal and the delay signal, so as to generate a first reference voltage and a second reference voltage; and
   wherein the first signal and the second signal are generated by comparing the first reference voltage and the second reference voltage with a base voltage respectively.

10. The method for measuring jitter of claim 9, wherein the plurality of loads are charged at a respective charging rate which is varied when the currents of the electric current sources are varied, whereby the jitter between the clock signal and the delay signal is amplified.

11. A method for measuring jitter, comprising:
    receiving a clock signal;
    generating a delay signal in response to the clock signal;
    generating a first signal and a second signal in response to the clock signal and the delay signal; and
    determining a phase difference between the first signal and the second signal;
    wherein the phase difference between the first signal and the second signal is an amplified amount of a jitter value of the clock signal; and
    wherein parts of the cycles of the clock signal and the delay signal are removed in response to the operational frequency before generating the first signal and the second signal.

12. A method for measuring jitter, comprising:
receiving a clock signal;
generating a delay signal in response to the clock signal;
generating a first signal and a second signal in response to the clock signal and the delay signal; and
determining a phase difference between the first signal and the second signal;
wherein the phase difference between the first signal and the second signal is an amplified amount of a jitter value of the clock signal; and
wherein when the phase difference between the clock signal and the delay signal is greater than a predetermined value, generation of the first signal and the second signal is terminated and the jitter measuring method is switched to a conventional method for measuring jitter, wherein said jitter value is measured from the phase difference between the clock signal and the delay signal.

* * * * *